US011778343B2

(12) United States Patent
Yang et al.

(10) Patent No.: US 11,778,343 B2
(45) Date of Patent: *Oct. 3, 2023

(54) METHODS AND CIRCUITRY FOR IMPROVING GLOBAL SHUTTER EFFICIENCY IN BACKSIDE ILLUMINATED HIGH DYNAMIC RANGE IMAGE SENSOR PIXELS

(71) Applicant: SEMICONDUCTOR COMPONENTS INDUSTRIES, LLC, Phoenix, AZ (US)

(72) Inventors: Dajiang Yang, San Jose, CA (US); Sergey Velichko, Boise, ID (US); Bartosz Piotr Banachowicz, San Jose, CA (US); Tomas Geurts, Haasrode (BE); Muhammad Maksudur Rahman, Santa Clara, CA (US)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 17/456,982

(22) Filed: Nov. 30, 2021

(65) Prior Publication Data

US 2022/0086375 A1 Mar. 17, 2022

Related U.S. Application Data

(63) Continuation of application No. 16/661,009, filed on Oct. 23, 2019, now Pat. No. 11,218,653.

(Continued)

(51) Int. Cl.
*H04N 25/58* (2023.01)
*H04N 25/63* (2023.01)
*H01L 27/146* (2006.01)

(52) U.S. Cl.
CPC ......... *H04N 25/58* (2023.01); *H01L 27/1464* (2013.01); *H01L 27/14627* (2013.01); *H01L 27/14656* (2013.01); *H04N 25/63* (2023.01)

(58) Field of Classification Search
CPC ........ H04N 25/58; H04N 25/63; H04N 25/59; H04N 25/616; H04N 25/671;
(Continued)

(56) References Cited

U.S. PATENT DOCUMENTS 7,244,918 B2 * 7/2007 McKee ............ H01L 27/14603
348/E3.018
7,829,832 B2 11/2010 Mauritzson
(Continued)

FOREIGN PATENT DOCUMENTS

JP 2017-076899 4/2017

OTHER PUBLICATIONS

Roux. "Automative In-cabin Sensing Solutions," Sep. 19, 2018.
(Continued)

*Primary Examiner* — Nhan T Tran
(74) *Attorney, Agent, or Firm* — Treyz Law Group, P.C.; Jason Tsai

(57) ABSTRACT

An image sensor may include an array of image sensor pixels. Each pixel in the array may be a global shutter pixel having a first charge storage node configured to capture scenery information and a second charge storage node configured to capture background information generated as a result of parasitic light and dark noise signals. The first and/or second charge storage nodes may each be provided with an overflow charge storage to provide high dynamic range (HDR) functionality. The background information may be subtracted from the scenery information to cancel out the desired background signal contribution and to obtain an HDR signal with high global shutter efficiency. The
(Continued)

charge storage nodes may be implemented as storage diode or storage gate devices. The pixels may be backside illuminated pixels with optical diffracting structures and multiple microlenses formed at the backside to distribute light equally between the two charge storage nodes.

19 Claims, 15 Drawing Sheets

Related U.S. Application Data

(60) Provisional application No. 62/871,899, filed on Jul. 9, 2019.

(58) Field of Classification Search
CPC .... H04N 25/771; H04N 25/57; H04N 25/633; H01L 27/14627; H01L 27/1464; H01L 27/14656; H01L 27/14609; H01L 27/14612; H01L 27/14623; H01L 27/14629; H01L 27/1463; H01L 27/14654; H01L 27/14614; H01L 27/14625; H01L 27/14641
See application file for complete search history.

(56) References Cited

U.S. PATENT DOCUMENTS

| | | | | |
|---|---|---|---|---|
| 8,785,831 | B2* | 7/2014 | Krymski | H04N 25/767 |
| | | | | 250/214 R |
| 8,928,792 | B1* | 1/2015 | Hynecek | H01L 27/14614 |
| | | | | 348/308 |
| 9,276,031 | B2* | 3/2016 | Wan | H01L 27/14623 |
| 9,706,142 | B2 | 7/2017 | Hynecek | |
| 9,748,298 | B2 | 8/2017 | Lenchenkov | |
| 9,853,080 | B2 | 12/2017 | Geurts | |
| 10,070,079 | B2 | 9/2018 | Hynecek | |
| 10,566,359 | B1* | 2/2020 | Leung | H04N 25/53 |
| 11,218,653 | B2* | 1/2022 | Yang | H01L 27/14609 |
| 2012/0044396 | A1 | 2/2012 | Rysinski | |
| 2012/0273854 | A1* | 11/2012 | Velichko | H01L 27/1461 |
| | | | | 257/E21.334 |
| 2013/0214371 | A1 | 8/2013 | Asatsuma | |
| 2014/0197301 | A1* | 7/2014 | Velichko | H04N 25/77 |
| | | | | 250/208.1 |
| 2014/0231879 | A1* | 8/2014 | Meynants | H01L 27/1463 |
| | | | | 257/230 |
| 2015/0228693 | A1* | 8/2015 | Toda | H01L 27/14818 |
| | | | | 257/229 |
| 2016/0155768 | A1* | 6/2016 | Yi | H01L 27/14638 |
| | | | | 257/225 |
| 2017/0092683 | A1* | 3/2017 | Geurts | H01L 27/14605 |
| 2017/0134675 | A1 | 5/2017 | Hynecek | |
| 2019/0067353 | A1* | 2/2019 | Tsao | H01L 27/14625 |
| 2019/0081098 | A1* | 3/2019 | Lenchenkov | H04N 25/75 |
| 2019/0096943 | A1* | 3/2019 | Lee | G02B 5/1814 |
| 2019/0098232 | A1 | 3/2019 | Mori | |
| 2019/0260949 | A1* | 8/2019 | Geurts | H01L 27/14636 |
| 2019/0349547 | A1* | 11/2019 | Velichko | H01L 25/167 |
| 2020/0273892 | A1* | 8/2020 | Perkins | H01L 27/14629 |
| 2022/0070396 | A1* | 3/2022 | Amikawa | H04N 25/59 |

OTHER PUBLICATIONS

Venezia et al. "1.5 um Dual Conversion Gain, Backside Illuminated Image Sensor Using Stacked Pixel Level Connections with 13ke—Full-Well Capacitance and 0.8e-Noise," IEEE Internal Electron Devices Meeting (IEDM) 2018.

* cited by examiner

METHODS AND CIRCUITRY FOR IMPROVING GLOBAL SHUTTER EFFICIENCY IN BACKSIDE ILLUMINATED HIGH DYNAMIC RANGE IMAGE SENSOR PIXELS

CROSS-REFERENCE TO RELATED APPLICATIONS

This application is a continuation of U.S. patent application Ser. No. 16/661,009, filed Oct. 23, 2019, which claims benefit of U.S. Provisional Patent Application No. 62/871,899, filed on Jul. 9, 2019, the entire contents of which are incorporated herein by reference.

BACKGROUND

This relates generally to imaging devices, and more particularly, to image sensors with global shutter pixels.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Column circuitry is coupled to each pixel column for reading out pixel signals from the image pixels. Row control circuitry is coupled to each pixel row for resetting, initiating charge transfer, or selectively activating a particular row of pixels for readout.

Machine-vision and other high-speed imaging applications demand global shutter operation with strict exposure control requirements. Depending on lighting conditions, minimizing the integration time is necessary in order to reduce motion artifacts and motion blur. Backside illuminated (BSI) pixel architectures typically exhibit better performance than front side illuminated (FSI) pixel architectures. BSI global shutter pixels that include charge domain storage nodes, however, suffer from low global shutter efficiency (GSE) due to difficulties in shielding in-pixel charge storage nodes from parasitic light. Additionally, the charge storage nodes suffer from dark signal non-uniformity. Moreover, certain applications require the BSI global shutter pixels to be operable in a high dynamic range (HDR) mode. Existing BSI global shutter architectures are only operable in either a GSE improvement mode or an HDR mode, but not both. The HDR mode is realized by staggering multiple exposures, a method which is likely to yield undesired motion artifacts.

It is within this context that the embodiments described herein arise.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
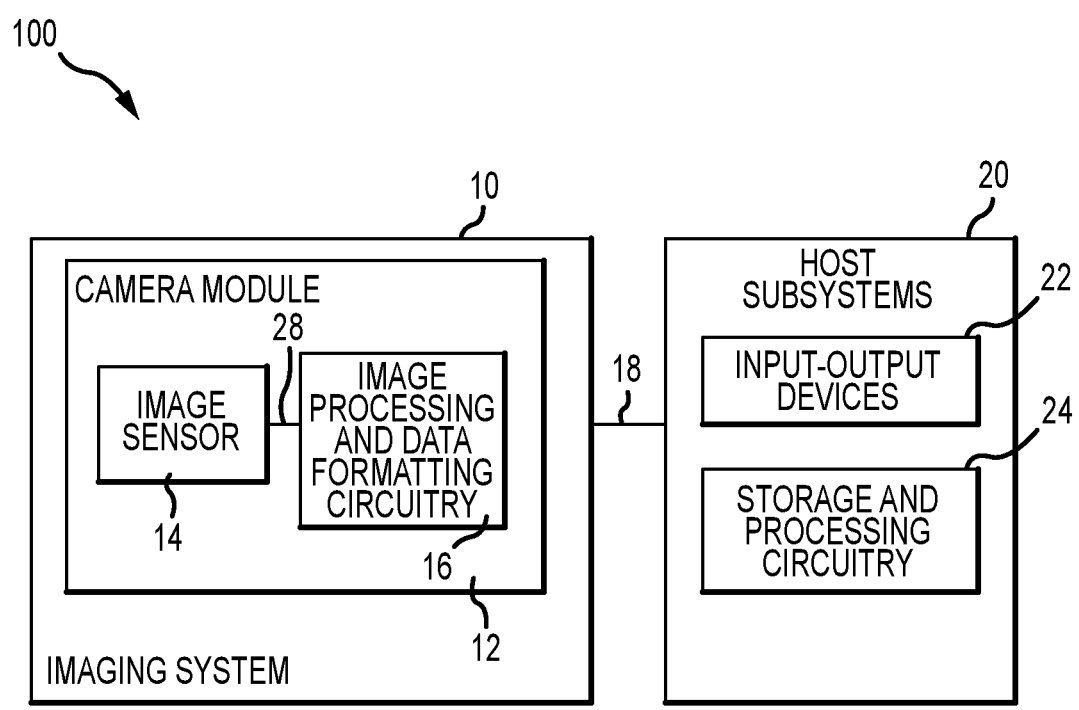
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., image sensor pixels) that convert the light into digital data. Image sensors may have any number of pixels (e.g., hundreds, thousands, millions, or more). A typical image sensor may, for example, have millions of pixels (e.g., megapixels). As examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
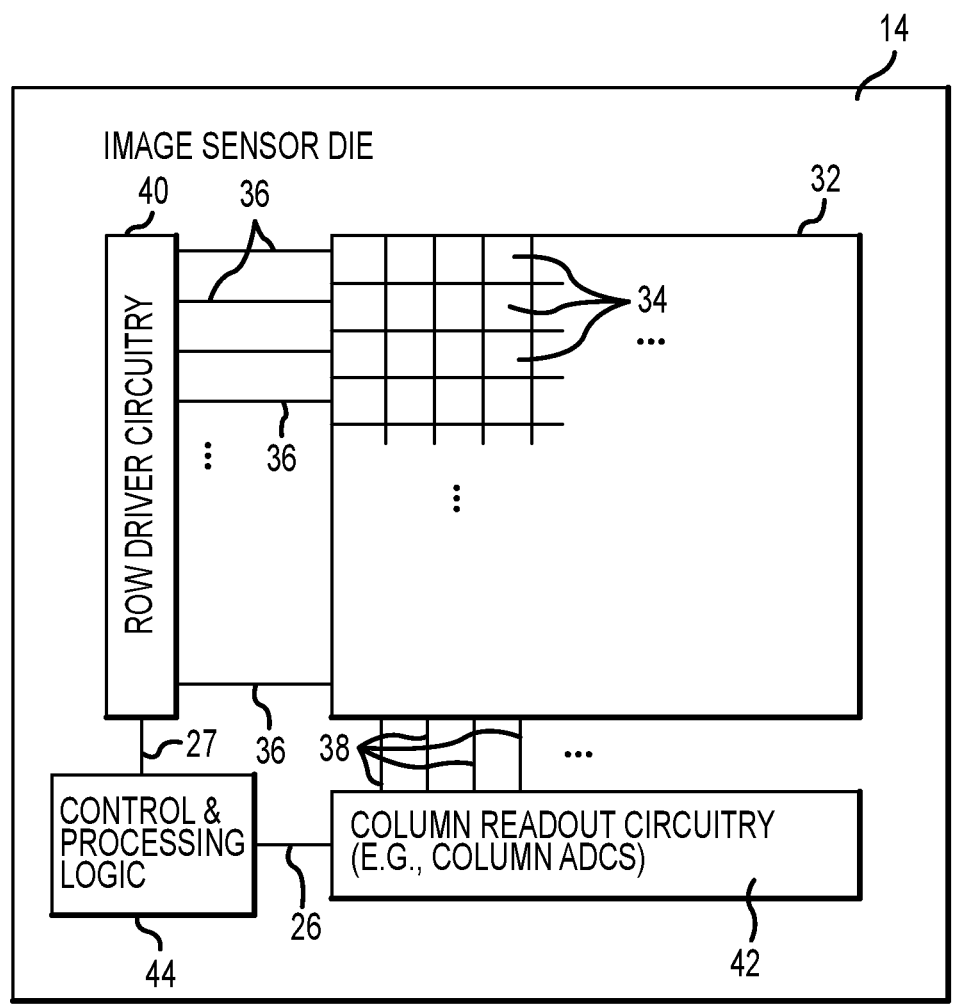
FIG. 2 is a diagram of an illustrative pixel array and associated row and column control circuitry for reading out image signals from an image sensor in accordance with an embodiment.

An example of an arrangement of image sensor 14 of FIG. 1 is shown in FIG. 2. As shown in FIG. 2, image sensor 14 may include control and processing circuitry 44. Control and processing circuitry 44 (sometimes referred to as control and processing logic) may sometimes be considered part of image processing and data formatting circuitry 16 in FIG. 1. Image sensor 14 may include a pixel array such as array 32 of pixels 34 (sometimes referred to herein as image sensor pixels, imaging pixels, or image pixels). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over control paths 36 (e.g., pixel reset control signals, charge transfer control signals, blooming control signals, row select control signals, dual conversion gain control signals, or any other desired pixel control signals).

Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

In general, backside illuminated (BSI) pixel architectures exhibit improved performance relative to front side illuminated (FSI) pixel architectures. However, BSI pixels that uses the global shutter (GS) readout method that relies on charge domain storage nodes often suffer from low global shutter efficiency due to difficulties in shielding in-pixel charge storage nodes from parasitic light. "Parasitic light" is defined as photons entering an image pixel during times other than the intended integration period, which then generate charge that is inadvertently collected by the pixel storage. This additional charge generated by the parasitic light (sometimes referred to as "parasitic light charge") will be added to the scenery image charge (i.e., charge collected from the scene during the proper integration time), which will create ghosting, smearing, or other undesired colorized effects if something in the scenery to be captured is moving. In any case, the parasitic light charge may create undesired vertical shading as rows are read out sequentially from the top of the array to the bottom of the array. Moreover, conventional image sensor pixels are not able to mitigate the effects of parasitic light while offering high dynamic range, which is a desirable feature in many imaging applications.

Figure 3:
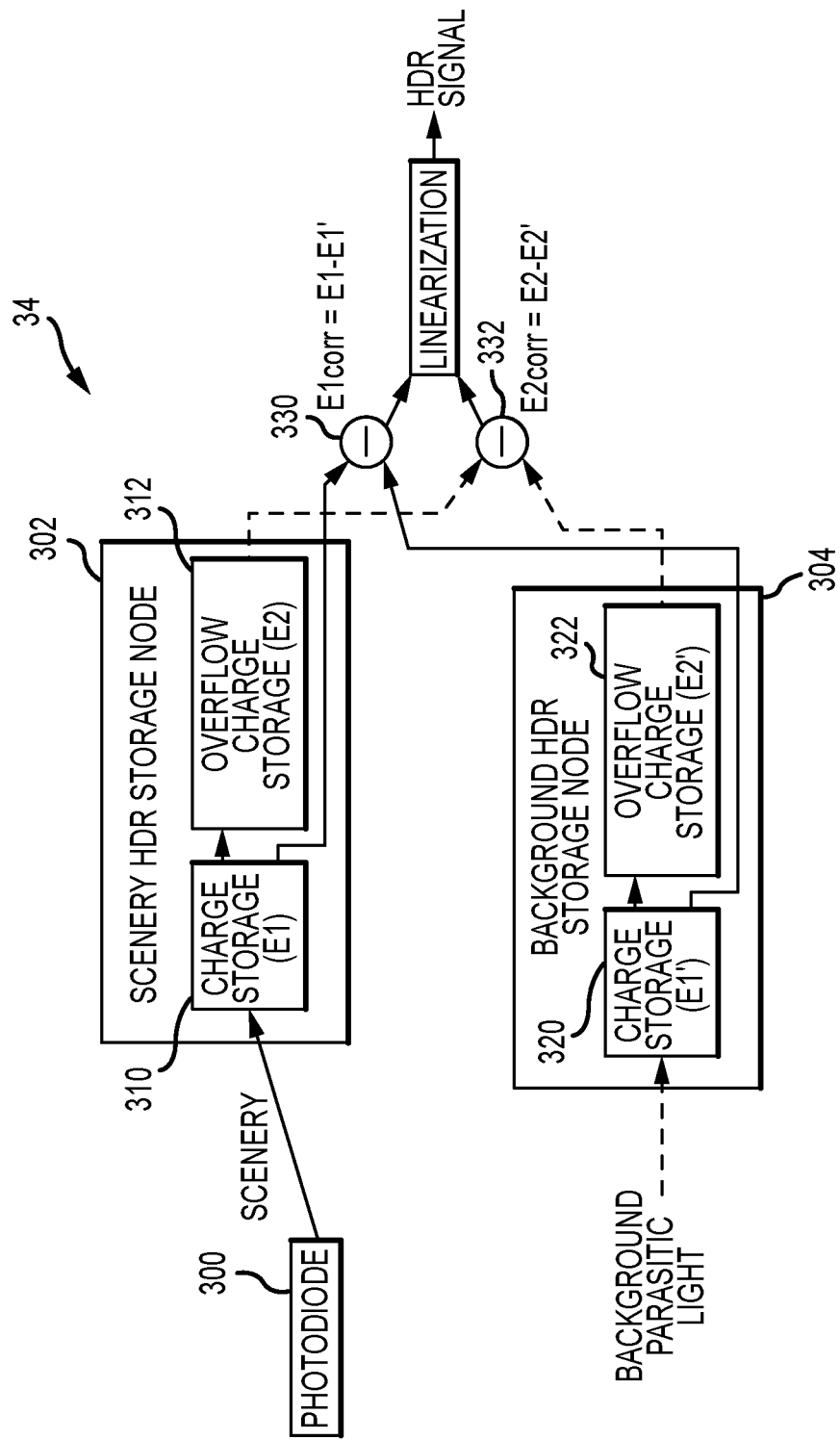
FIG. 3 is a diagram of an illustrative image pixel readout scheme that uses a first storage node to acquire scenery information and a second storage node to accumulate charge generated from parasitic light and dark noise in parallel with the first storage node in accordance with an embodiment.

In accordance with an embodiment, an image sensor pixel architecture is provided that is capable of providing both an improvement to global shutter efficiency (GSE) and high dynamic range (HDR) operation without generating any motion artifacts. FIG. 3 is a diagram of an illustrative image pixel readout architecture that uses a first storage node to acquire scenery information and a second storage node to accumulate charge generated from parasitic light and dark noise in parallel with the first storage node. As shown in FIG. 3, image sensor pixel 34 may include a photosensitive element such as photodiode 300, a first storage node such as storage node 302 configured to capture scenery information, and a second storage node such as storage node 304 configured to accumulate charge generated from background signals such as parasitic light and dark noise signals.

Photodiode 300 may be configured to accumulate charge generated by photons emanating from the scenery to be captured during an integration time. The scenery-generated charge may be conveyed from photodiode 300 to first storage node 302. Storage node 302 may include a charge storage region 310 that receives the scenery-generated charge from photodiode 300 and stores a corresponding amount of charge E1. Any amount of charge exceeding a first predetermined threshold amount may spill over to overflow storage region 312, which will end up storing a corresponding amount of overflow charge E2. Charge E1 therefore corresponds to a low light signal, whereas charge E2 corresponds to a high light signal. Overflow charge storage region 312 therefore provides first storage node 302 with HDR capabilities with a single PD exposure. First storage node 302 operated in this way is therefore sometimes referred to as a scenery HDR storage node.

In contrast, the scenery-generated charge is not directly conveyed from photodiode 300 to second storage node 304. During scenery acquisition, storage node 304 may accumulate parasitic light charge and dark noise signals in parallel. The amount of dark noise is generally dependent on the operating temperature and is typically not related to the amount of light being generated within pixel 34. Storage node 304 may include a charge storage region 320 and an overflow charge storage region 322 that receive the parasitic light charge and the dark noise charge (sometimes referred to collectively as background charge or background signals). Storage region 320 stores a corresponding amount of charge E1'. Any amount of charge exceeding a second predetermined threshold amount may spill over to overflow storage region 322, which will end up storing a corresponding amount of charge E2' comprised of overflow charge and parasitic light charge and dark noise charge from storage region 322. Charge E1' therefore corresponds to the parasitic light charge and the dark noise charge signal for storage region 320, whereas charge E2' corresponds to the overflow charge, parasitic light charge, and the dark noise charge signal for storage region 322. Second storage node 304 operated in this way is therefore sometimes referred to as a background HDR storage node.

After charge has been accumulated in storage nodes 302 and 304, charge E1' read out from charge storage region 320 may be subtracted from charge E1 read out from charge storage region 310 using a subtraction circuit 330 to generate a first corrected non-overflow signal E1 corr. Similarly, charge E2' read out from charge storage region 322 may be subtracted from charge E2 read out from charge storage region 312 using a subtraction circuit 332 to generate a second corrected overflow signal E2corr. Corrected signals E1corr and E2corr may then be combined via a linearization process to output the final HDR output signal. Subtraction circuits 330 and 332 and the linearizing component may be formed as part of control and processing logic 44 (FIG. 2) on the image sensor die 14 or as part of image processing and data formatting circuitry 16 (FIG. 1) separate from image sensor 14. Subtracting the accumulated background signals from the scenery signals in this way provides GSE improvement, reduced dark signal non-uniformity, and HDR operation without any unwanted motion artifacts.

Figure 4:
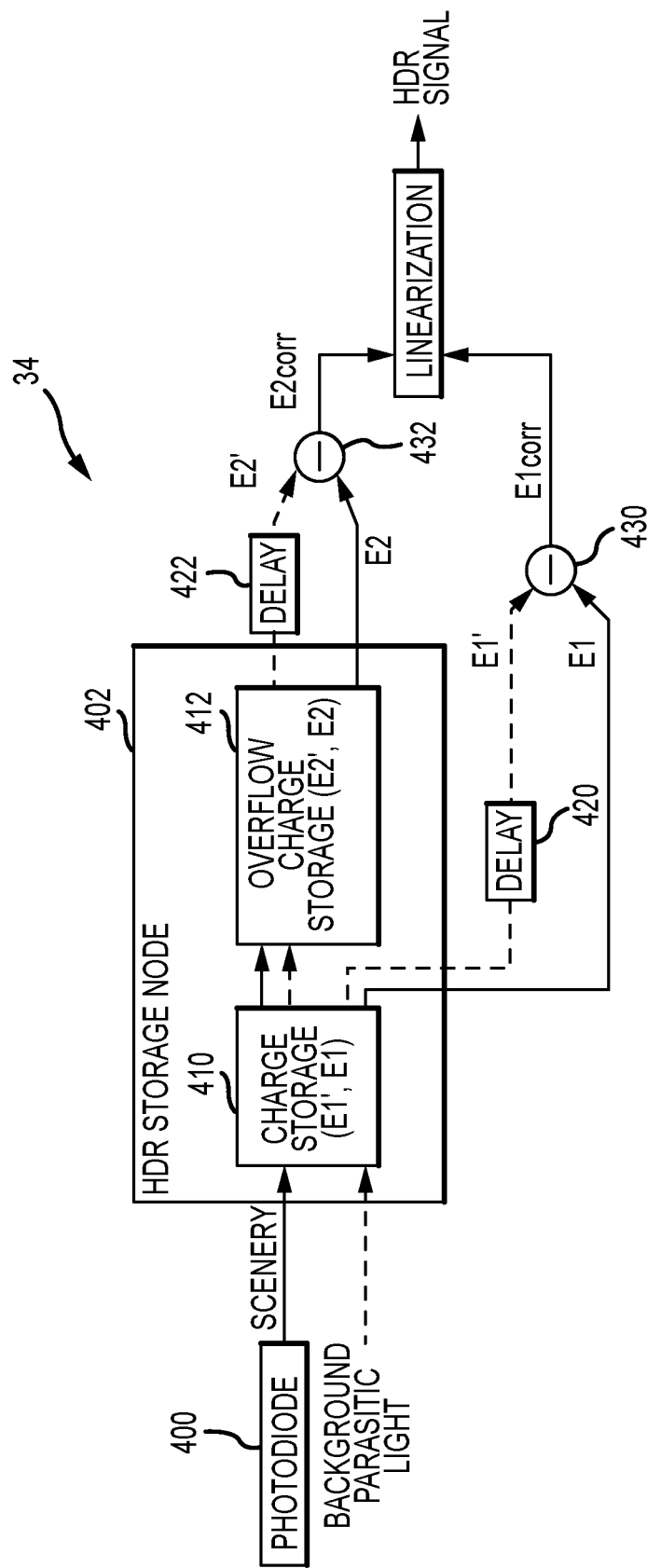
FIG. 4 is a diagram of an illustrative image pixel readout scheme that uses a single storage node to accumulate charge generated from parasitic light and dark noise in a first period and then to capture scenery information in a second period following the first period in accordance with an embodiment.

FIG. 4 is a diagram of another illustrative image pixel readout architecture that uses a single storage node 402 to accumulate charge generated from parasitic light and dark noise in a first period and then to capture scenery information in a second period following the first period (i.e., the two signal captures are acquired sequentially instead of in parallel). As shown in FIG. 4, image sensor pixel 34 may include a photosensitive element such as photodiode 400 and a single dual-purpose storage node such as storage node 402.

During a first phase, storage node 402 may accumulate parasitic light charge and dark noise signals. Storage node 402 may include a charge storage region 410 that receives the background signals (e.g., the parasitic light charge and the dark noise charge) and stores a corresponding amount of charge E1'. Any amount of charge exceeding a given predetermined threshold amount may spill over to overflow storage region 412, which also receives the background signals (e.g., the parasitic light charge and the dark noise charge) and will end up storing a corresponding amount of overflow and background charge E2'. Overflow charge storage region 412 provides storage node 402 with HDR capabilities. Storage node 402 operated in this way is therefore sometimes referred to as an HDR storage node.

During a second phase, storage node 402 may receive scenery-generated charge from photodiode 400 accumulated during an integration time. In particular, charge storage region 410 may receive the scenery-generated charge from photodiode 400 and store a corresponding amount of charge E1. Any amount of charge exceeding the given predetermined threshold amount may spill over to overflow storage region 412, which will end up storing a corresponding amount of overflow charge E2.

Charge E1' generated during the first phase may be read out and then signal delayed by a first delay buffer 420, whereas charge E2' generated during the second phase may be read out and then signal delayed by a second delay buffer 422. Delayed in this way, signal E1' obtained during the first phase may be subtracted from signal E1 obtained during the second phase using a subtraction circuit 430 to generate a first corrected non-overflow signal E1corr. Similarly, signal E2' obtained during the first phase may be subtracted from signal E2 obtained during the second phase using a subtraction circuit 432 to generate a second corrected overflow signal E2corr. Corrected signals E1corr and E2corr may then be combined via a linearization process to output the final HDR output signal. Delay circuits 420 and 422, subtraction circuits 430 and 432, and the linearization component may be formed as part of control and processing logic 44 (FIG. 2) on image sensor die 14 or as part of image processing and data formatting circuitry 16 (FIG. 1) separate from image sensor 14. Subtracting the accumulated background signals from the scenery signals in this sequential manner enables GSE improvement, reduced dark signal non-uniformity, and HDR operation while minimizing any undesired motion artifacts.

Figure 5A:
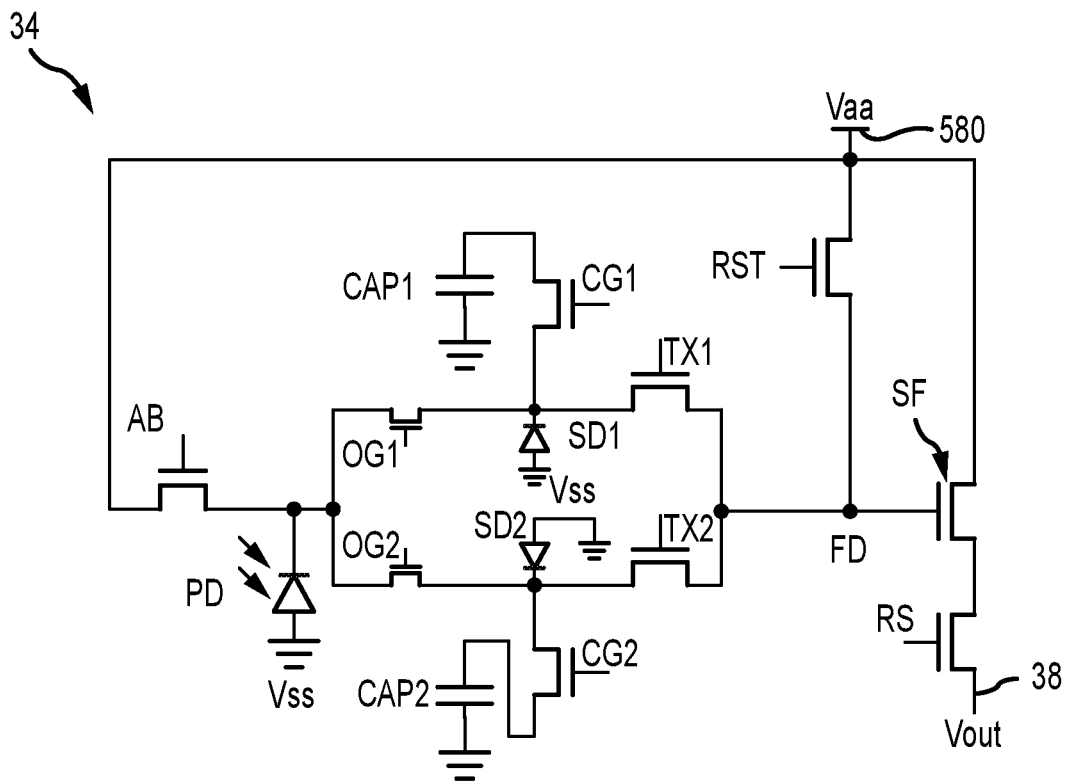
FIG. 5A is a circuit diagram of an illustrative image sensor pixel having at least two storage diodes and two overflow capacitors to implement the pixel readout scheme shown in FIG. 3 in accordance with an embodiment.

FIG. 5A shows one suitable circuit implementation supporting the pixel readout architecture of the type described in connection with FIG. 3. As shown in FIG. 5A, image pixel 34 may represent a global shutter pixel with a pinned photodiode PD coupled to an anti-blooming transistor that is partially activated using control signal AB in order to draw away blooming charge from the photodiode. The anti-blooming transistor may also be fully activated using control signal AB to reset the photodiode.

Photodiode PD may be coupled to a first storage diode SD1 via a first output gate transistor controlled by signal OG1. Storage diode SD1 may be coupled to a first overflow capacitor CAP1 via a first overflow gate (or coupling gate) transistor controlled by signal CG1. Storage diode SD1 may also be coupled to a floating diffusion node FD via a first transfer gate transistor controlled by signal TX1.

Photodiode PD may also be coupled to a second storage diode SD2 via a second output gate transistor controlled by signal OG2. Storage diode SD2 may be coupled to a second overflow capacitor CAP2 via a second overflow gate (or coupling gate) transistor controlled by signal CG2. Storage diode SD2 may also be coupled to floating diffusion node FD via a second transfer gate transistor controlled by signal TX2. Overflow capacitors CAP1 and CAP2 may be implemented using high density metal-insulator-metal (MIM) capacitive structures configured to support more than 100 dB of dynamic range (as an example). In general, any suitable integrated circuit capacitor structure may be used within pixel 34.

Any charge transferred to floating diffusion node FD causes the potential on this node to change, and this change is sensed by the source follower transistor SF. The source terminal of the source follower transistor is connected via a row select transistor to the sensor array column sensing line 38 that delivers the pixel signal to the periphery of the array for further processing. Control signal RS is asserted to activate the row select transistor to transfer the pixel signal to column sensing line 38. After charge sensing has been completed, floating diffusion node FD may be reset to supply voltage Vaa (e.g., a nominal positive power supply voltage provided on power supply line 580) by asserting control signal RST to turn on the reset transistor. If desired, storage diodes SD1 and SD2 can be reset at the same time as the floating diffusion node by simultaneously asserting signals RST, TX1, and/or TX2.

Arranged in this way, storage diode SD1 may be configured to store low scenery light charge E1 (see FIG. 3) and capacitor CAP1 may be configured to store high scenery light charge E2, whereas storage diode SD2 may be configured to store background light charge E1' and capacitor CAP2 may be configured to store backlight light charge E2'. In other words, storage diode SD1 implements charge storage region 310 while CAP1 implements overflow charge storage region 312, whereas storage diode SD2 implements charge storage region 320 while CAP2 implements overflow charge storage region 322.

The global shutter image sensor pixel 34 shown in FIG. 5A is merely illustrative and is not intended to limit the scope of the present embodiments. This pixel scheme may be extended or applied to pixel architectures with three, four, or more charge storage nodes/regions per pixel. In general, global shutter image sensor pixel 34 may include any number of charge storage regions and any number of associated charge transfer, charge resetting, readout, and selection transistors for supporting a global shutter readout operation.

Figure 5B:
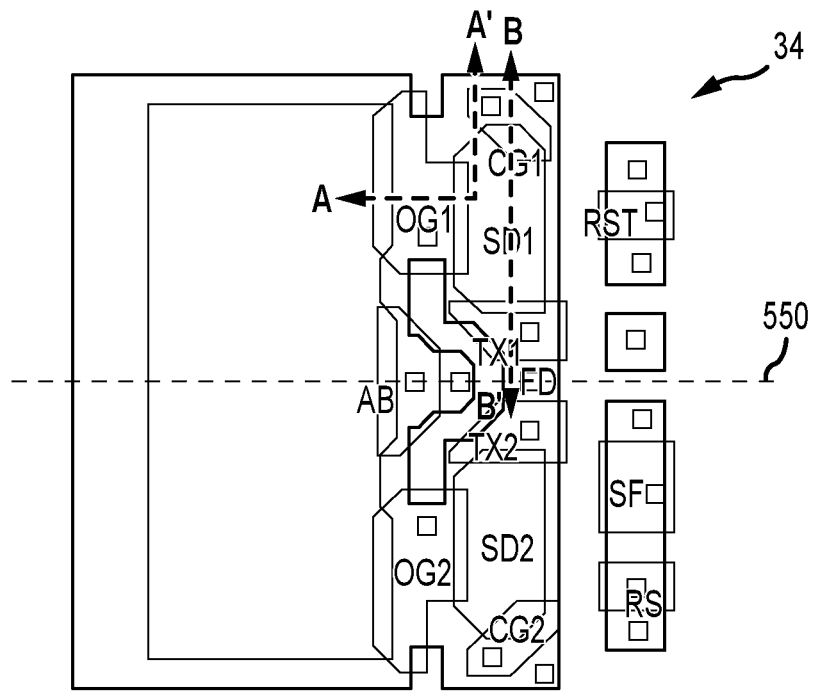
FIG. 5B is a top layout view of the illustrative image sensor pixel shown in FIG. 5A in accordance with an embodiment.

FIG. 5B is a top layout view of the illustrative image sensor pixel shown in FIG. 5A. As shown in FIG. 5B, pixel 34 may be substantially symmetrical about symmetry line 550 (except for the reset, source follower, and row select transistors), where the anti-blooming transistor and the floating diffusion node may be bisected by the symmetry line 550. The first output gate, the first transfer gate, the first storage diode, the first overflow gate, and the reset transistor may be formed on one side of the symmetry line 550, whereas the second output gate, the second transfer gate, the second storage diode, the second overflow gate, the source follower transistor, and the reset transistor may be formed on the other side of the symmetry line 550.

Figure 5C:
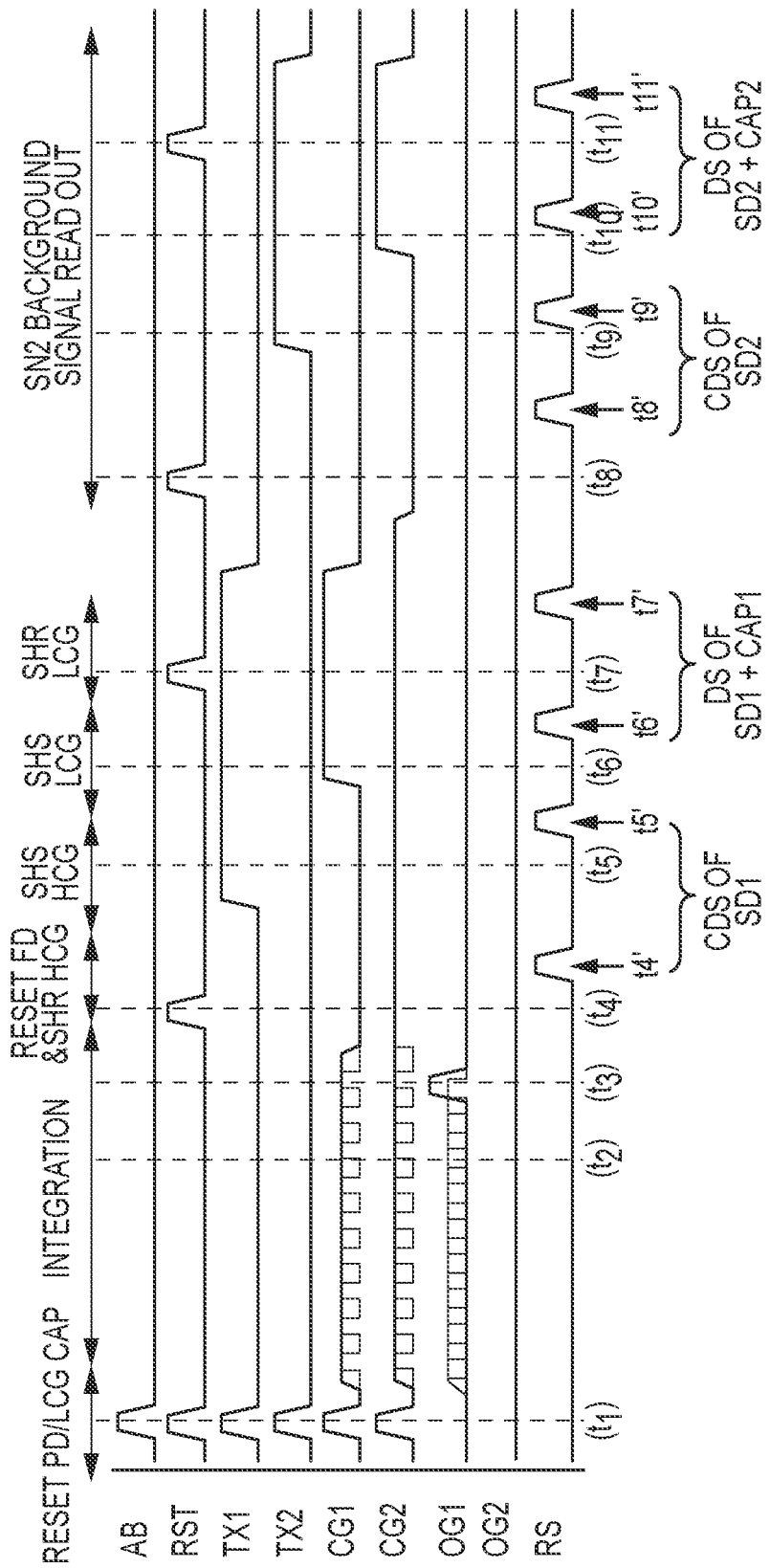
FIG. 5C is a timing diagram showing the behavior of signals for operating the image sensor pixel shown in FIG. 5A in accordance with an embodiment.

FIG. 5C is a timing diagram showing the behavior of signals for operating the image sensor pixel shown in FIG. 5A. At time t1, anti-blooming gate control signal AB, reset signal RST, transfer gate control signals TX1 and TX2, and overflow gate control signals CG1 and CG2 may be pulsed high to reset photodiode PD, the two storage diodes SD1 and SD2, and the overflow capacitors CAP1 and CAP2. The period following time t1 (i.e., the time period between t1 and t4) may represent the integration time (sometimes referred to as the exposure period).

During integration, control signals OG1, CG1, and CG2 may be raised to an intermediate voltage level (e.g., some static voltage level between positive power supply voltage Vaa and ground Vss) or may be repeatedly/partially pulsed. Pulsing or partially activating OG1 during integration allows the photon-generated charge to overflow from the photodiode into storage diode SD1 when the photodiode is full. Pulsing or partially activating CG1 and CG2 would allow excess charge in storage diodes SD1 and SD2 to overflow to corresponding capacitors CAP1 and CAP2 when the storage diodes become full.

At time t3, signal OG1 may be fully asserted to perform a global transfer of charge from all of the photodiodes into their corresponding storage diodes SD1. At time t4, reset signal RST may be pulsed high to reset the floating diffusion node. At time t4', row select signal RS may be pulsed high to obtain a sample-and-hold reset (SHR) signal for the reset floating diffusion node. Prior to time t5, transfer signal TX1 may be driven high to transfer the low light signal from storage diode SD1 to the floating diffusion node. After time t5 (i.e., at time t5'), row select signal RS may be pulsed high to obtain a sample-and-hold sensor (SHS) signal for the charge previously stored in storage diode SD1. The signal values obtained at times t4' and t5' may be subtracted using a correlated double sampling (CDS) method to compute the final output signal for storage diode SD1. Since the charge stored in storage diode SD1 represents low light, high conversion gain is sometimes needed to amplify the low light signals. Thus, signal readout mechanisms associated with SD1 is sometimes referred to as high conversion gain (HCG) SHR and SHS operations.

At time t6, control signal CG1 may be pulsed high to transfer all the overflow charge (e.g., the high light signals) from capacitor CAP1 to storage diode SD1 and to floating diffusion FD. Some time after time t6 (i.e., at time t6'), row select signal RS may be pulsed high to obtain a sample-and-hold sensor (SHS) signal for charge that represents the sum of charge previously stored in storage diode SD1 and capacitor CAP1. At time t7, reset signal RST may be pulsed high to reset the floating diffusion node. At time t7', row select signal RS may be pulsed high to obtain a sample-and-hold reset (SHR) signal for the reset floating diffusion node. The signal values obtained at times t6' and t7' may be subtracted using a double sampling (DS) method to compute the final output signal corresponding to the sum of charge from SD1 and CAP1 (i.e., the sum of both low light and high light signals). Since the charge stored in CAP1 represents high light, low conversion gain is used to process the high light signals. Thus, signal readout mechanisms associated with (SD1+CAP1) is sometimes referred to as low conversion gain (LCG) SHR and SHS operations.

This process may be repeated when reading out the background signals accumulated using second storage diode SD2. At time t8, reset signal RST may be pulsed high to again reset the floating diffusion node. At time t8', row select signal RS may be pulsed high to obtain an SHR signal for the reset floating diffusion node. At time t9, transfer signal TX2 may be driven high to transfer background charge (e.g., charge generated as a result of parasitic light and dark noise current) from storage diode SD2 to the floating diffusion node. Thereafter (at time t9'), row select signal RS may be pulsed high to obtain an SHS signal for the charge previously stored in storage diode SD2. The signal values obtained at times t8' and t9' may be subtracted using a correlated double sampling (CDS) method to compute the final output signal for storage diode SD2.

At time t10, control signal CG2 may be pulsed high to transfer all the overflow charge from capacitor CAP2 to storage diode SD2 and to floating diffusion FD. Some time after time t10 (i.e., at time t10'), row select signal RS may be pulsed high to obtain an SHS signal for charge that represents the sum of charge previously stored in storage diode SD2 and capacitor CAP2. At time t11, reset signal RST may be pulsed high to reset the floating diffusion node. At time t11', row select signal RS may be pulsed high to obtain an SHR signal for the reset floating diffusion node. The signal values obtained at times t10' and t11' may be subtracted using a double sampling (DS) method to compute the final output signal corresponding to the sum of charge from SD2 and CAP2.

Figure 5D:
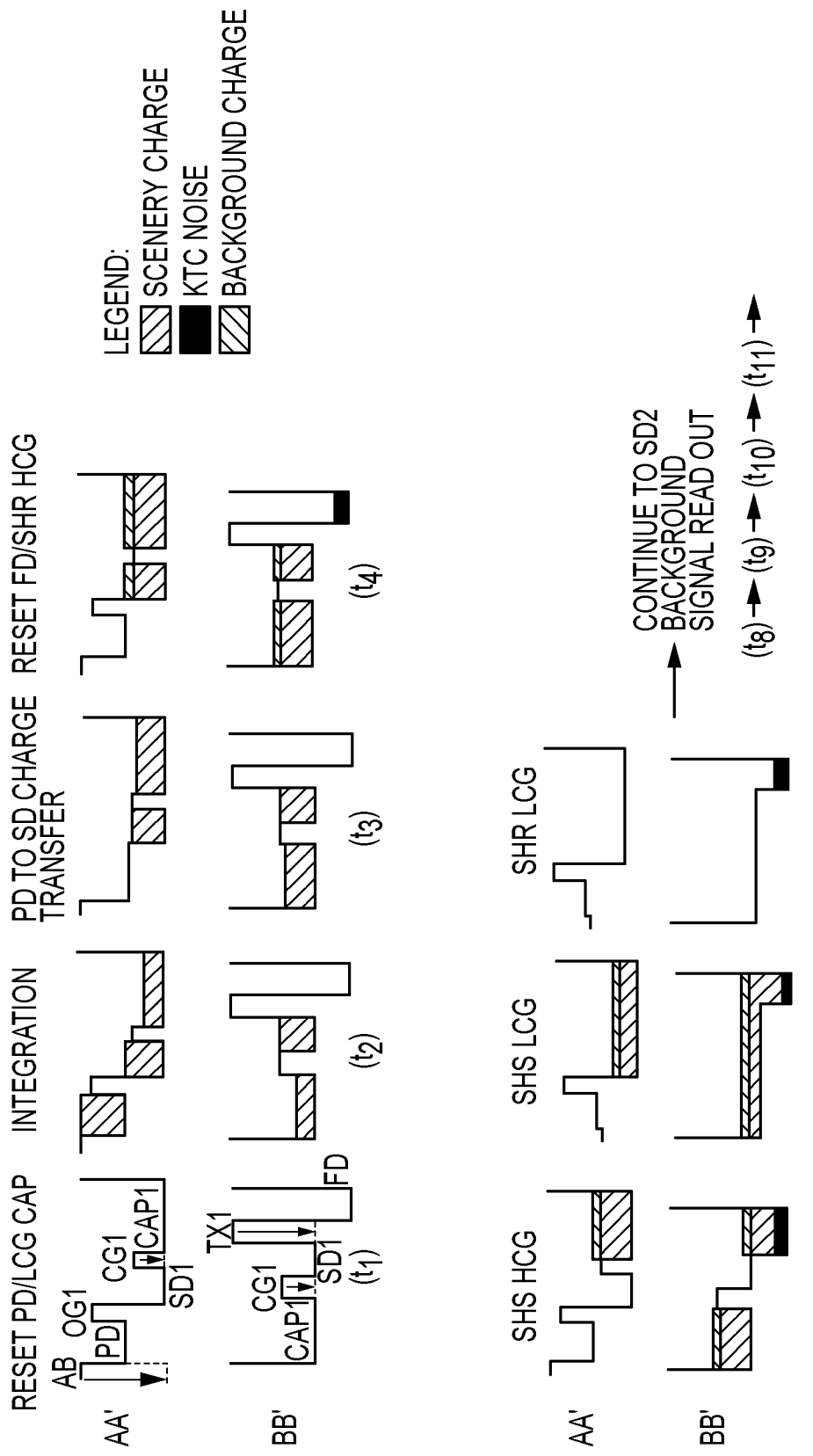
FIG. 5D is a potential diagram illustrating the flow of charge at different time slices of the operation shown in FIG. 5C in accordance with an embodiments.

FIG. 5D is a potential diagram illustrating the flow of charge at different time slices of the operation shown in FIG. 5C. In particular, FIG. 5D shows both the potential profile along the cross-section of pixel 34 cut along line AA' (see FIG. 5B) and along the cross-section of pixel 34 cut along line BB'. At time t1, all storage regions are reset so that any existing signal charge is drained. At time t2 (i.e., during integration time), photodiode PD may fill up. Assuming OG1 is pulsed or partially raised, storage diode SD1 may fill up as well. Since CG1 is pulsed or partially raised, capacitor CAP1 may also accumulate charge.

At time t3 (at the end of the integration/exposure period), OG1 is pulsed high to transfer all charge from photodiode PD to storage diode SD1. At time t4, the floating diffusion node may be reset. Note that thermal noise (sometimes referred to as sampling noise or KTC noise) may be present in the floating diffusion region. Note also that background charge may also accumulate in SD1 and CAP1. At this point, SHR of the HCG signal associated with only SD1 may be read out.

At time t5, TX1 may be asserted to transfer all charge from SD1 to FD while high light charge is retained in CAP1. Thereafter SHS of the HCG signal associated with only SD1 may be read out. These SHR and SHS may be subtracted using a correlated double sampling (CDS) method to compute the final output signal for storage diode SD1. At time t6, CG1 may be asserted to transfer all charge from CAP1 to SD1 and then to FD since TX1 is still asserted. As a result, the sum of charge from SD1 and CAP1 are now present in FD. At this point, SHS of the LCG signal associated with (SD1+CAP1) may be read out. At time t7, RST may be asserted to drain out all signal charge from the pixel while leaving only KTC noise. At this point, SHR of the LCG signal associated with (SD1+CAP1) may be read out. Double sampling may be separately performed for the SHS and SHR signals to compute the final output signal corresponding to the sum of charge from SD1 and CAP1. Processing may continue (see, e.g., time t8–t11 in FIG. 5C) to perform readout for only the background signal charge. Computing the difference in signal values obtained during time t1–t7 versus signal values obtained during time t8–t11 can therefore remove any unwanted contribution from the background charge (e.g., to reduce any potential signal inaccuracies due to parasitic light and/or dark signal non-uniformity).

Figure 6:
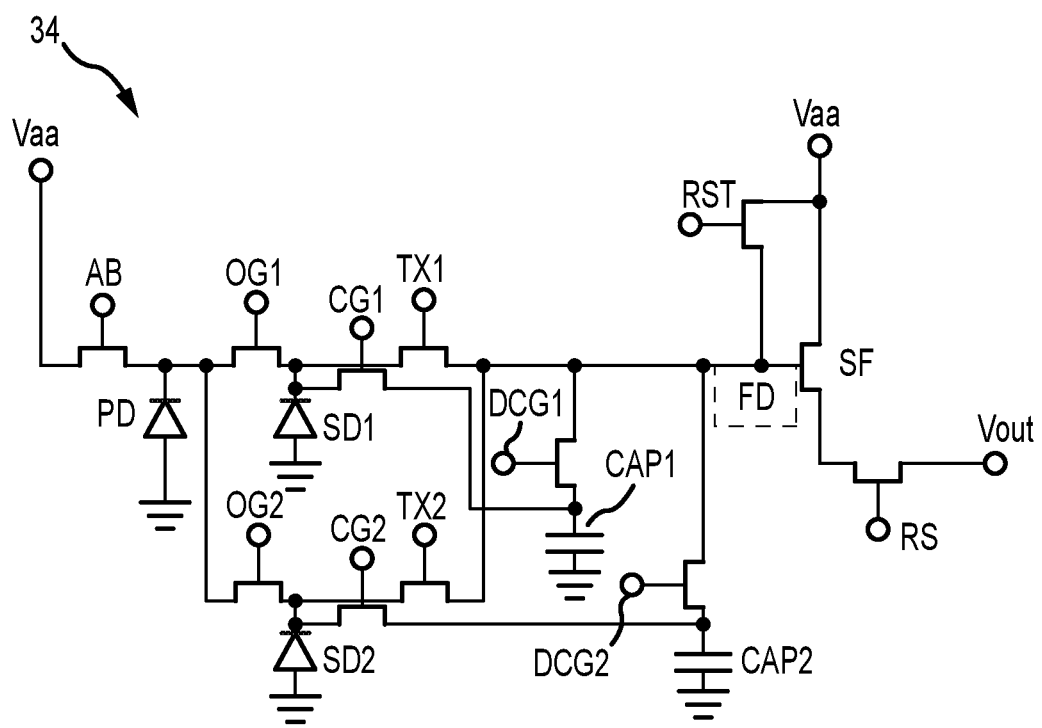
FIG. 6 is a circuit diagram of an illustrative image sensor pixel having at least two storage diodes, two overflow capacitors, and two dual conversion gates in accordance with an embodiment.

FIG. 6 is a circuit diagram showing another suitable implementation of pixel 34. In comparison to the pixel architecture of FIG. 5A, the pixel architecture of FIG. 6 further includes a first dual conversion gate (e.g., the transistor controlled by signal DCG1) that couples capacitor CAP1 directly to the floating diffusion node and a second dual conversion gate (e.g., the transistor controlled by signal DCG2) that couples capacitor CAP2 directly to the floating diffusion node. The addition of the dual conversion gates provides pixel 34 with the ability to selectively reset the overflow capacitors CAP1 and/or CAP2 during integration to a higher potential, thereby further extending the dynamic range of pixel 34.

Figure 7:
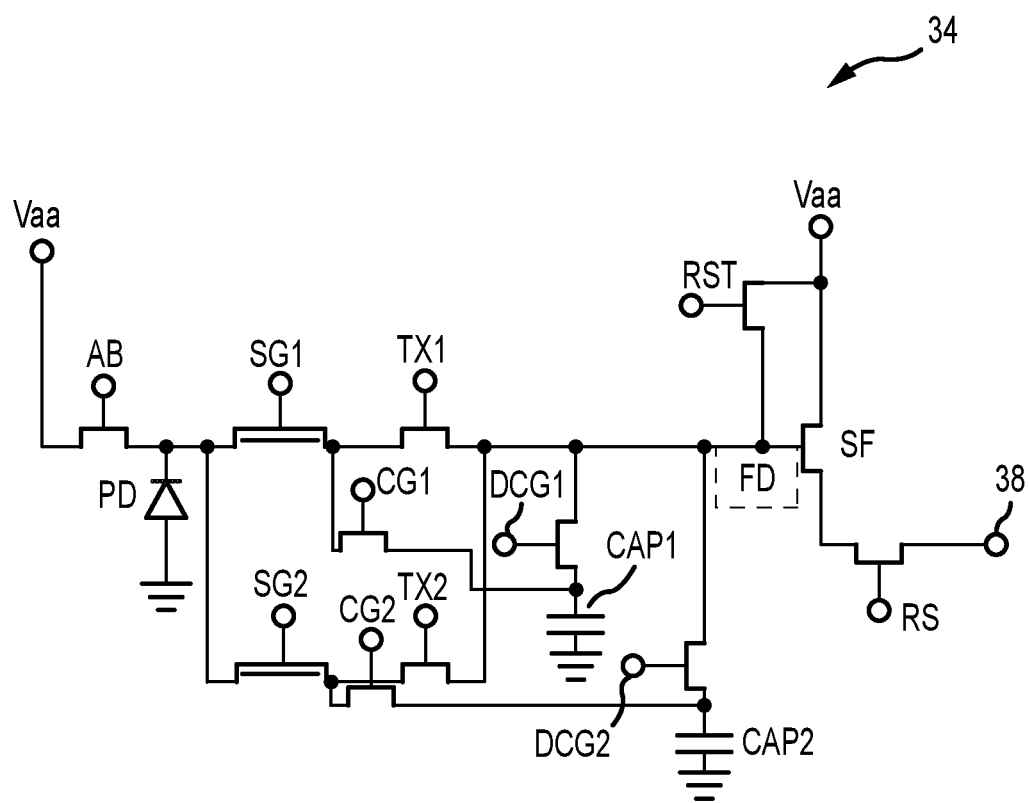
FIG. 7 is a circuit diagram of an illustrative image sensor pixel having at least two storage gate based charge storage nodes, two overflow capacitors, and two dual conversion gates in accordance with an embodiment.

FIG. 7 is a circuit diagram showing another suitable implementation of pixel 34. In comparison to the pixel architecture of FIG. 6, the pixel architecture of FIG. 7 uses storage gates in lieu of the output gate and storage diode pair. As shown in FIG. 7, a first storage gate that is controlled by signal SG1 replaces the first output gate and the first storage diode SD1, whereas a second storage gate that is controlled by signal SG2 replaces the second output gate and the second storage diode SD2. Similar to the example of FIG. 6, the inclusion of the dual conversion gates provides pixel 34 with the ability to selectively reset the overflow capacitors CAP1 and/or CAP2 during the exposure period to a higher potential, thereby further extending the dynamic range of pixel 34.

Figure 8A:
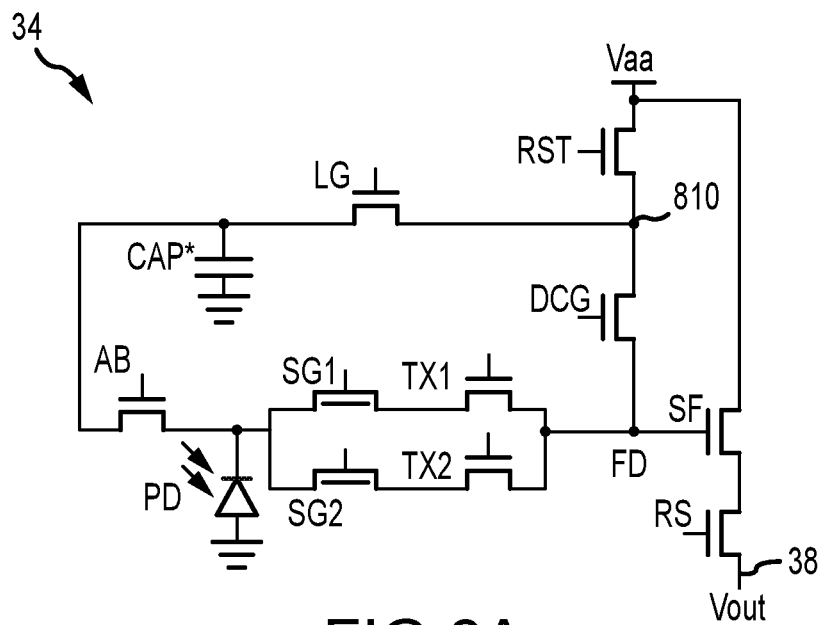
FIG. 8A is a circuit diagram of an illustrative image sensor pixel having at least two storage gates and a single overflow capacitor in accordance with an embodiment.

FIG. 8A is a circuit diagram illustrating yet another suitable arrangement of pixel 34. As shown in FIG. 8A, image pixel 34 may represent a global shutter pixel with pinned photodiode PD that is coupled to a single shared overflow capacitor CAP* (e.g., a MIM capacitor) via an anti-blooming transistor controlled by control signal AB. Photodiode PD may be coupled to a first storage gate controlled by signal SG1 and also to a second storage gate controlled by signal SG2. Similar to the embodiment of FIG. 7, the first storage gate performs the function of the first output gate and the first storage diode SD1 (see FIG. 5A), whereas the second storage gate performs the function of the second output gate and the second storage diode SD2. The first storage gate may be coupled to the floating diffusion node FD via a first transfer gate (e.g., a first charge transfer transistor controlled by transfer signal TX1), whereas the second storage gate may be coupled to the floating diffusion node FD via a second transfer gate (e.g., a second charge transfer transistor controlled by transfer signal TX2).

Any charge transferred to floating diffusion node FD causes the potential on this node to change, and this potential change is sensed by the source follower transistor SF. The source terminal of the source follower transistor is connected via a row select transistor to the sensor array column sensing line 38 that delivers the pixel signal to the periphery of the array for further processing. Control signal RS is asserted to activate the row select transistor to transfer the pixel signal to column sensing line 38. A dual conversion gate (e.g., the transistor controlled by signal DCG) may be coupled between floating diffusion node FD and the reset transistor. After charge sensing has been completed, floating diffusion node FD may be reset to supply voltage Vaa (e.g., a nominal positive power supply voltage provided on power supply line 580) by asserting control signal RST to turn on the reset transistor and asserting control signal DCG to turn on the DCG transistor.

Moreover, the overflow capacitor CAP* may be coupled to the node interposed between the dual conversion gate and the reset transistor (i.e., node 810) via a low gain transistor controlled by signal LG. Overflow capacitor CAP*, which stores high light signals, is only coupled to node 810 during a low gain phase by selectively asserting signal LG.

Arranged in this way, the second storage gate may be configured to store low scenery light charge E1 (see FIG. 3), whereas the first storage gate may be configured to store low background light charge E1'. Pixel 34 can still support HDR functionality but cannot support cancellation of the background parasitic/dark noise charge associated with the high light signals.

The global shutter image sensor pixel 34 shown in FIG. 8A is merely illustrative and is not intended to limit the scope of the present embodiments. This pixel scheme may be extended or applied to pixel architectures with three, four, or more charge storage nodes/regions per pixel implemented using storage diodes or other suitable types of charge storage means. In general, global shutter image sensor pixel 34 may include any number of charge storage regions, any number of shared or unshared overflow capacitors, and any number of associated charge transfer, charge resetting, readout, and selection transistors for supporting a global shutter readout operation.

Figure 8B:
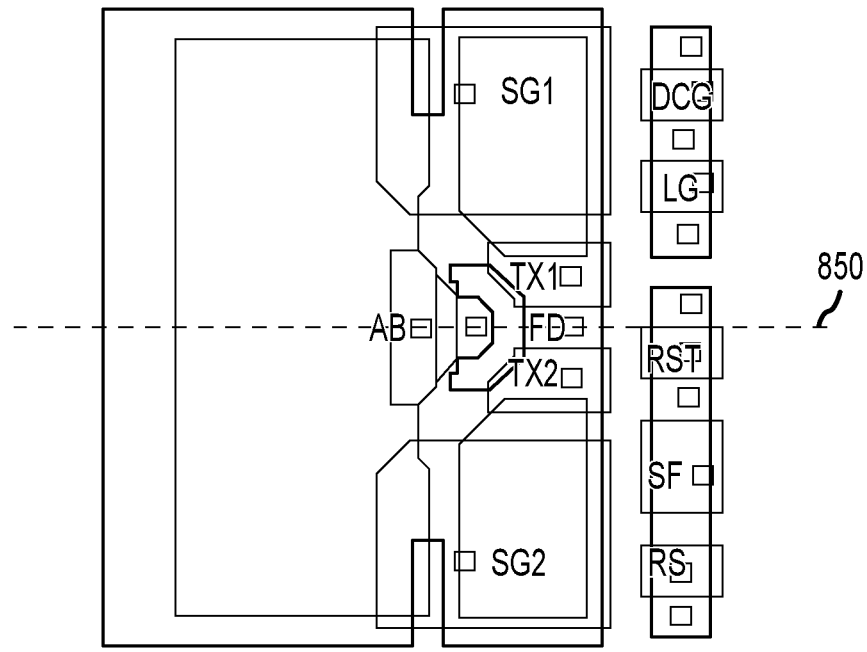
FIG. 8B is a top layout view of the illustrative image sensor pixel shown in FIG. 8A in accordance with an embodiment.

FIG. 8B is a top layout view of the illustrative image sensor pixel shown in FIG. 8A. As shown in FIG. 8B, pixel 34 may be substantially symmetrical about symmetry line 850 (if ignoring the DCG, LG, RST, SF, and RS transistors), where the anti-blooming transistor and the floating diffusion node are bisected by the symmetry line 850. The first transfer gate, the first storage gate, the low gain transistor, and the dual conversion gate may be formed on one side of the symmetry line 550, whereas the second transfer gate, the second storage gate, the row select transistor, the source follower transistor, and the reset transistor may be formed on the other side of the symmetry line 850.

Figure 8C:
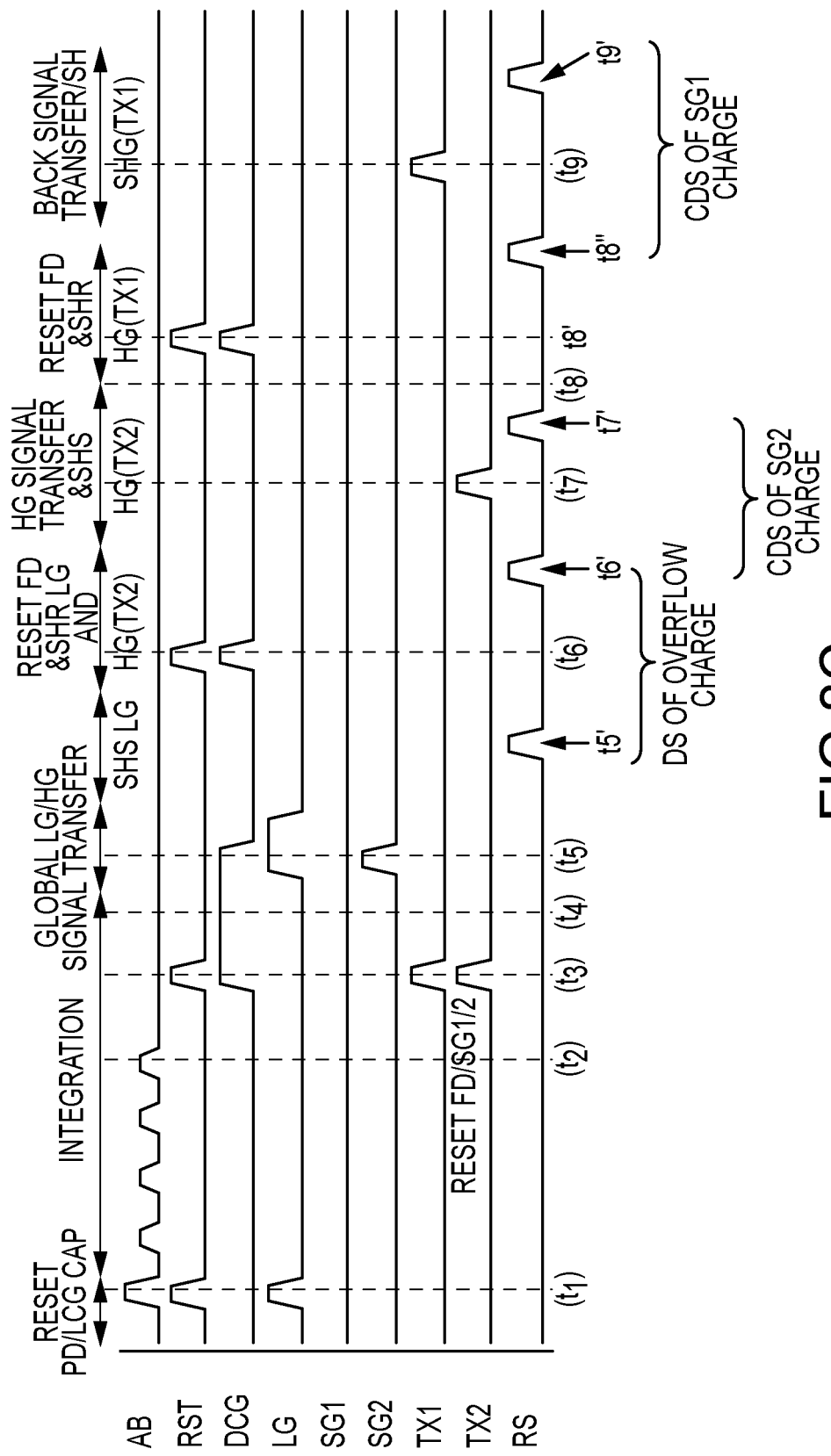
FIG. 8C is a timing diagram showing the behavior of signals for operating the image sensor pixel shown in FIG. 8A in accordance with an embodiment.

FIG. 8C is a timing diagram showing the behavior of signals for operating the image sensor pixel shown in FIG. 8A. At time t1, anti-blooming gate control signal AB, reset signal RST, and the low gain control signal LG may be pulsed high to reset photodiode PD and also the overflow capacitor CAP*. The period following time t1 (i.e., the time period between t1 and t4) may represent the integration time (sometimes referred to as an exposure period).

During integration, anti-blooming control signal AB may be repeatedly partially pulsed or raised to an intermediate voltage level (e.g., some static voltage level between positive power supply voltage Vaa and ground Vss). Pulsing or partially activating AB during integration allows the photon-generated charge to overflow from the photodiode into the overflow capacitor CAP* when the photodiode is full, such as up to time t5.

At time t3, control signals RST, DCG, TX1 and TX2 may all be pulsed high to reset the floating diffusion node, the first storage gate, and the second storage node. Note that the storage gates are drained through the floating diffusion node via the two intervening charge transfer gates. At time t4, signals RST, TX1, and TX2 are low, but signal DCG may continue to be asserted until a subsequent global charge transfer has completed at time t5.

At time t5, before signal DCG is driven low, low gain control signal LG and second storage gate control signal SG2 may be pulsed high to perform a global charge transfer from the photodiode PD to the second storage gate and from the overflow capacitor CAP* to node 810. Since DCG is also high at this time, the overflow signal from CAP* is also transferred to the floating diffusion node via the dual conversion gate. At time t5', row select signal RS may be pulsed high to obtain a sample-and-hold sensor (SHS) signal equivalent to the charge previously stored in capacitor CAP*. At time t6, control signals RST and DCG may be pulsed high to reset the floating diffusion node. Thereafter, at time t6', row select signal RS may be pulsed high to obtain a sample-and-hold reset (SHR) signal for the reset floating diffusion node. The signal values obtained at times t5' and t6' may be subtracted using the double sampling (DS) method to compute the final output signal for the overflow (high light) charge.

At time t7, transfer signal TX2 may be pulsed high to transfer scenery charge accumulated at the second storage gate to the floating diffusion node. At time t7', row select signal RS may again be pulsed high to obtain an SHS signal for the charge previously stored in the second storage gate. The signal values obtained at times t6' and t7' may be subtracted using the correlated double sampling (CDS) method to compute the final output (low light scenery) signal associated with the second storage gate.

At time t8, the first storage gate still holds the background charge (e.g., the parasitic light charge and the dark noise charge). At time t8', control signals RST and DCG may be pulsed high to reset the floating diffusion node. Thereafter, at time t8", row select signal RS may be pulsed high to obtain a sample-and-hold reset (SHR) signal for the reset floating diffusion node. At time t9, transfer signal TX1 may be pulsed high to transfer background charge accumulated at the first storage gate to the floating diffusion node. At time t9', row select signal RS may again be pulsed high to obtain an SHS signal for the charge previously stored in the first storage gate. The signal values obtained at times t8" and t9' may be subtracted using the correlated double sampling (CDS) method to compute the final output (parasitic light and dark noise) signal associated with the first storage gate.

Figure 8D:
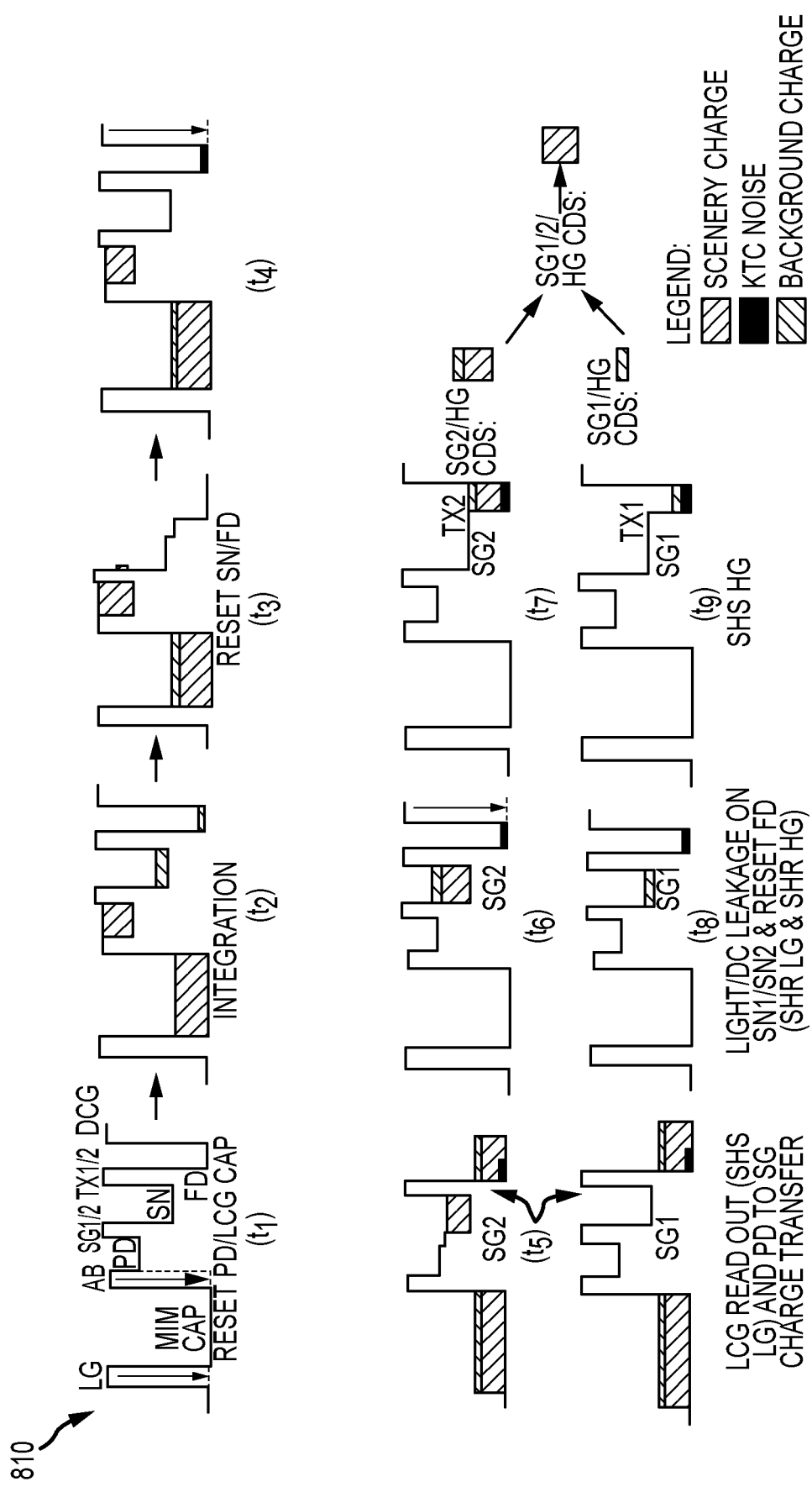
FIG. 8D is a potential diagram illustrating the flow of charge at different time slices of the operation shown in FIG. 8C in accordance with an embodiments.

FIG. 8D is a potential diagram illustrating the flow of charge at different time slices of the operation shown in FIG. 8C. At time t1, at least some of the storage regions (e.g., the overflow capacitor region, the photodiode region, etc.) are reset so that any existing signal charge is drained. At time t2 (i.e., during integration time), photodiode PD may fill up. Since signal AB is pulsed or partially raised during integration, overflow capacitor CAP* may start filling up as well. Note that background charge (e.g., charge generated as a result of parasitic light and/or dark current) may begin to accumulate in the storage gate regions and the floating diffusion node.

At time t3, the storage gate regions are drained through the floating diffusion node via the two intervening charge transfer gates. At time t4, the transfer gate potentials (TX1/TX2) are raised back high. The thermal KTC noise may remain in the floating diffusion node.

At time t5, before signal DCG is driven low, low gain control signal LG and second storage gate control signal SG2 may be pulsed high to perform a global charge transfer from the photodiode PD to the second storage gate and from the overflow capacitor CAP* to node 810. Since DCG is also high at this time, the overflow signal from CAP* is also transferred to the floating diffusion node via the dual conversion gate. Note that the potential of the first storage gate is not affected at this time.

At time t6, the floating diffusion node is reset while the scenery charge remains trapped in the second storage gate region. At time t7, the scenery charge may be transferred from the second storage gate region to the floating diffusion node and then read out using CDS. At time t8, the first storage gate still holds the background charge. At time t9, the background charge may be transferred from the first storage gate region to the floating diffusion node and then read out using CDS. The two correlated double sampled signals (e.g., a first CDS signal obtained from times t6' and t7' and a second CDS signal obtained from times t8" and t9') may then be subtracted from one another (e.g., the second CDS signal may be subtracted from the first CDS signal) to cancel out the background signal contribution for the low light signals.

Figure 9A:
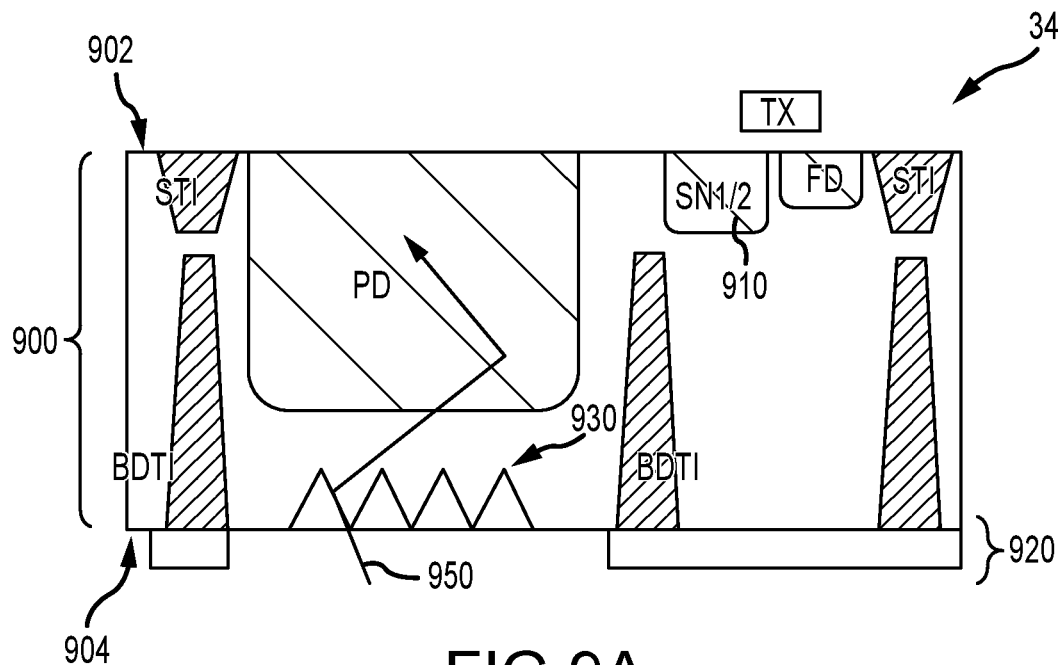
FIGS. 9A and 9B are cross-sectional side views of a backside illuminated (BSI) image sensor pixel having backside light diffracting structures in accordance with an embodiment.

As described above, the embodiments of the type described in connection with FIGS. 3-8 may be implemented using BSI pixels. FIG. 9A is a cross-sectional side view of an illustrative BSI pixel 34. As shown in FIG. 9A, pixel 34 may be formed using a semiconductor substrate 900 and may include a photodiode PD formed from the front side (or front surface) 902 of substrate 900, storage nodes 910 (e.g., storage regions associated with the storage diodes of FIGS. 5-6 or the storage gates of FIGS. 7-8) formed in the front surface 902 of the substrate, floating diffusion region FD formed in the front surface 902 of the substrate, charge transfer gate TX formed on front surface 902 of the substrate, and other gate structures which are also formed on the front side 902 of substrate 900 (not shown to avoid obscuring the present embodiments). Furthermore, shallow trench isolation (STI) structures may also be formed at the front side of the substrate to help separate adjacent pixels.

At the opposing back side (or back surface) 904 of substrate 900, backside deep trench isolation (BDTI) structures may be formed to provide electrical and optical isolation between adjacent pixels and also to protect the charge storage regions and the floating diffusion region from incoming light. An optical shielding structure such as metal shield 920 may be formed on the back side 904 of the substrate to provide additional shielding. In the example of FIG. 9A, metal shield 920 may at least partially cover or completely cover the charge storage regions and/or the floating diffusion region of pixel 34. In one suitable arrangement, metal shielding structure 920 may form a metal grid over the back surface of substrate 900 with slots or openings aligned to the footprint of the photodiode regions to allow incoming light to reach the photodiodes.

In a BSI arrangement, incoming light enters pixels 34 from the back surface 904 of the substrate (as indicated by arrow 950) and is preferably absorbed within photodiode region PD. In an ideal scenario, the incoming light 950 is fully absorbed within photodiode PD and never reaches the two storage regions. In practice, however, the incoming light 950 can sometimes inadvertently leak into one or more of the storage regions 910. This light leakage is especially problematic for pixel arrangements that depend on the design of two different storage nodes such as the pixel architectures of FIGS. 3-8.

In order to mitigate the potential imbalanced light leakage, optical diffracting structures such as light diffracting structures 930 may be formed at the back side of substrate 900 (see, e.g., FIG. 9A). Light diffracting structures 930 may be implemented as an array of pyramidal structures, conical structures, funnel-shaped structures, triangular-shaped structures, or may have other suitable shapes and may be formed using silicon, silicon dioxide, silica-based ceramic materials, inorganic/organic polymers, or other suitable dielectric material. Configured in this way, optical diffracting structures 930 can help ensure that the same amount of stray or parasitic light is distributed evenly between the two intra-pixel storage regions (e.g., by further randomizing the trajectory of light within the pixel), which improves the noise cancellation performance of pixel 34.

Figure 9B:
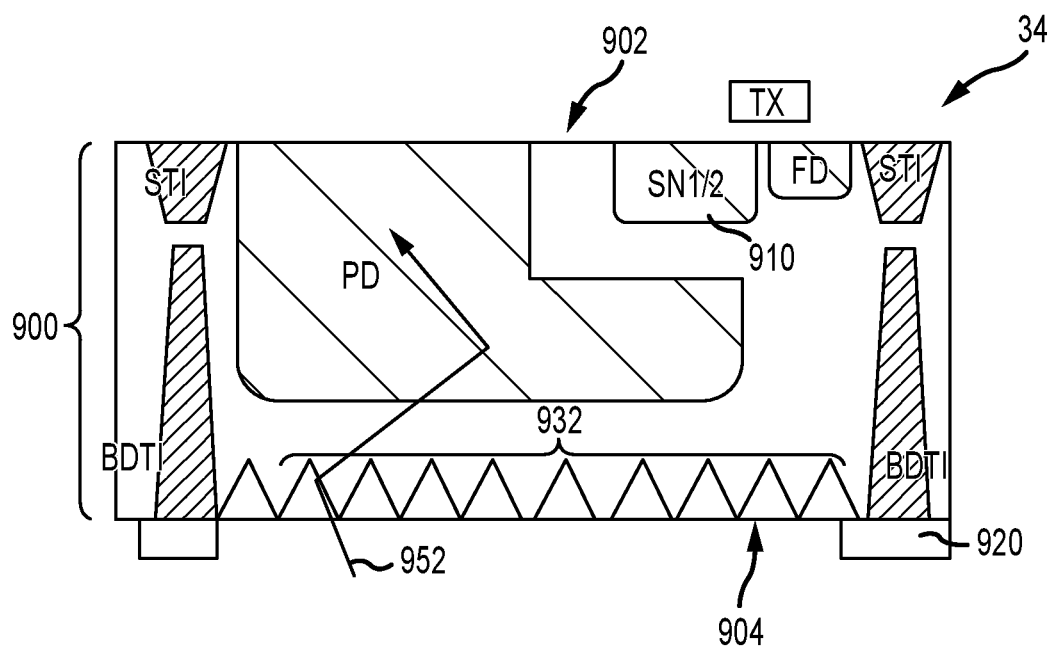

In yet another suitable arrangement, the metal shield 920 can be made with larger openings as illustrated in the example of FIG. 9B. As shown in FIG. 9B, metal shield 920 no longer cover the storage and floating diffusion regions and since the metal shield slots are wider, the photodiode region can extend at least partially under the storage regions, which helps further improve global shutter efficiency. In such scenarios, the optical diffracting structures 932 may also be extended under the entire footprint of the pixel to ensure that light is evenly distributed between the two charge storage regions.

Figure 10A:
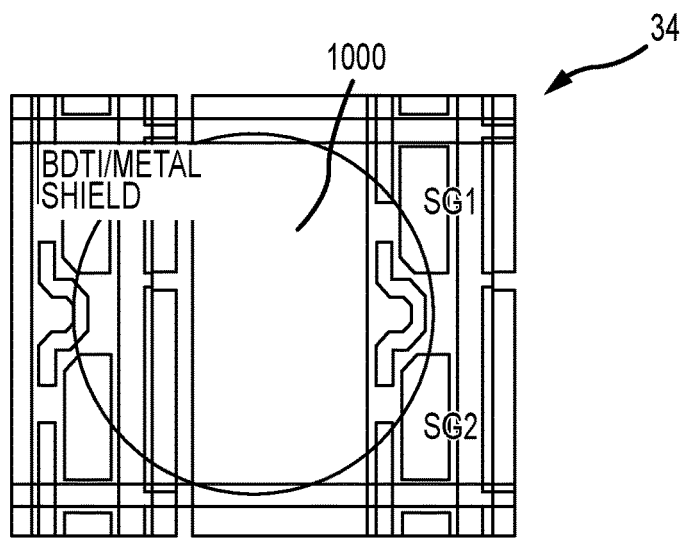
FIGS. 10A, 10B and 10C are top layout views showing how one or more microlenses may be formed over an image sensor pixel with two charge storage nodes in accordance with an embodiment.
Figure 10B:
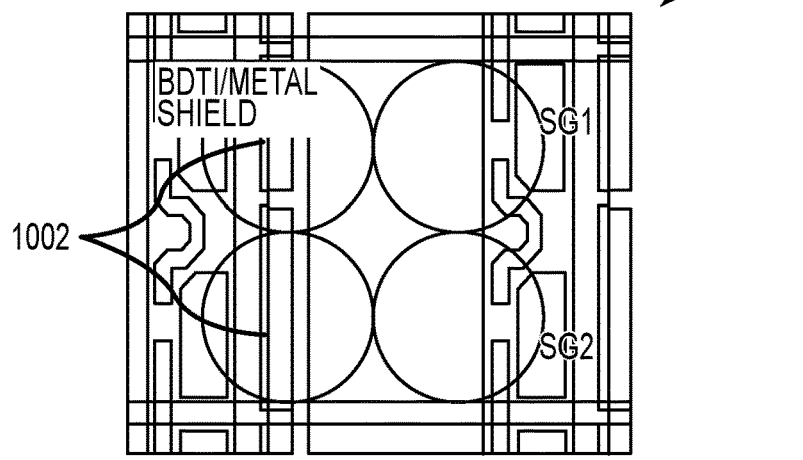
Figure 10C:
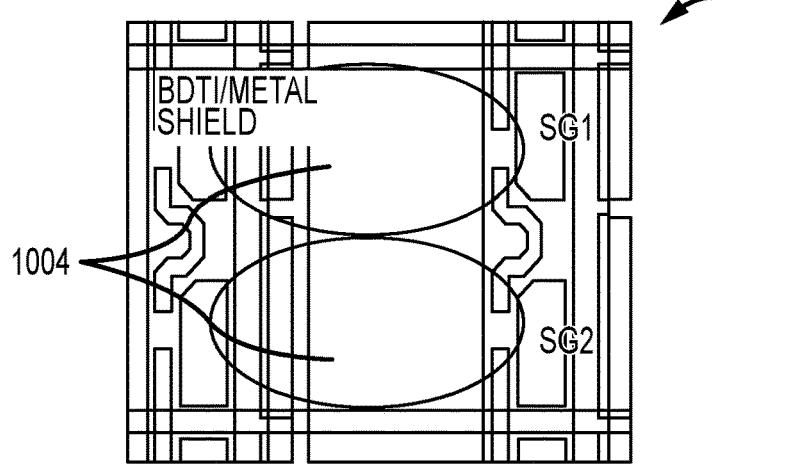

FIGS. 10A, 10B and 10C are top layout views showing how one or more microlenses may be formed over an image sensor pixel with two or more charge storage nodes. In the example of FIG. 10A, a single microlens 1000 may be formed over pixel 34. The center of microlens 1000 may be aligned to corresponding photodiode of pixel 34. The example of FIG. 10 in which pixel 34 includes two storage diodes SG1 and SG2 such as the embodiments of FIGS. 7 and 8 is merely illustrative. In other suitable arrangements, pixel 34 may include multiple charge storage nodes implemented as storage diodes or other types of charge storage regions.

FIG. 10B illustrates another suitable arrangement in which image pixel 34 is provided with four separate microlenses 1002 (e.g., four circular microlenses of the same size). The inclusion of multiple microlenses may provide better optical symmetry between the four quadrants of pixel 34, which can help ensure that parasitic light charge is equally distributed between the two storage gate regions. In the example of FIG. 10B, at least two of the microlenses 1002 may at least partially cover or overlap with storage gate regions SG1 and SG2. This is, however, merely illustrative. In other suitable embodiments, storage gates SG1 and SG2 may not be covered by any microlenses (e.g., microlenses 1002 are non-overlapping with the storage gate regions).

FIG. 10C illustrates yet another suitable arrangement in which image pixel 34 is provided with only two separate microlenses 1004 (e.g., two oval microlenses of the same size). A first of the two microlenses 1004 may be aligned with the first storage gate region, whereas a second of the two microlenses 1004 may be aligned with the second storage gate region. The inclusion of multiple microlenses may provide better optical symmetry between the two halves of pixel 34, which can help ensure that parasitic light charge is equally distributed between the two storage gate regions. In the example of FIG. 10C, both microlenses 1004 may at least partially cover or overlap with storage gate regions SG1 and SG2. This is, however, merely illustrative. In other suitable embodiments, storage gates SG1 and SG2 need not be covered by any microlenses (e.g., microlenses 1004 are non-overlapping with the storage gate regions).

In general, the number of microlenses may be adjusted depending on the number of charge storage regions in pixel 34. For example, a BSI image pixel with two charge storage regions may include two or more microlenses formed over the back surface of the substrate; a BSI image pixel with three charge storage regions may include three or more microlenses formed over the back surface of the substrate; a BSI image pixel with four charge storage regions may include four or more microlenses formed over the back surface of the substrate; etc.

Figure 11:
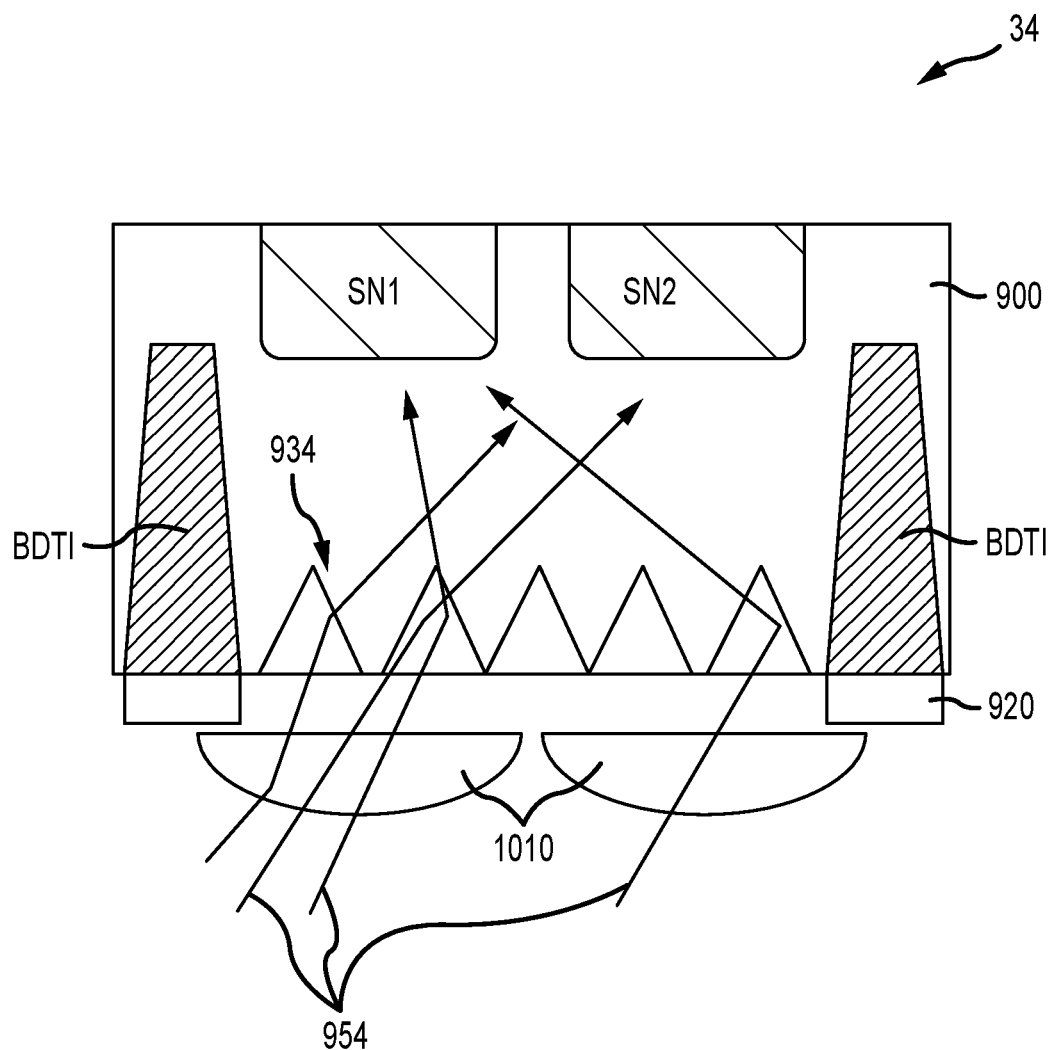
FIG. 11 is a cross-sectional side view of an illustrative image sensor pixel with two charge storage nodes, backside optical diffracting structures, and multiple microlenses formed over the backside surface to help distribute parasitic light evenly to the two charge storage nodes in accordance with an embodiment.

The use of backside optical diffracting structures of the type described in connection with FIGS. 9A and 9B and the use of multiple microlenses shown in FIGS. 10A, 10B, and 10B are not mutually exclusive and may both be used in a single embodiment to optimally reduce the optical difference between the two charge storage regions. FIG. 11 is a cross-sectional side view of an illustrative image sensor pixel 34 with at least two charge storage nodes SN1 and SN2, backside optical diffracting structures 934, and multiple microlenses 1010 formed over the backside substrate surface to help distribute parasitic light evenly to the two charge storage nodes. As shown in FIG. 11, a first of the two microlenses 1010 may be formed over the first storage node SN1, whereas a second of the two microlenses 1010 may be formed over the second storage node SN2. Both the first and second microlenses 1010 are configured to direct incoming light towards the underlying photodiode and are also configured in a way such that any light that would be received by SN1 and SN2 are randomized. The backside light diffracting structures 934 (e.g., an array of pyramidal or conical light diffracting structures formed at the back substrate surface) may help randomize the incoming light so that light is evenly dispersed between SN1 and SN2. In general, the use of optical diffracting structures and/or multiple microlenses shown in FIGS. 9-11 may be applied to any of the pixel architectures described in connection with FIGS. 3-8 to help improve global shutter efficiency.

The embodiments described herein can help improve global shutter efficiency without sacrificing HDR functionality. If desired, however, the techniques described in connection with FIGS. 3-11 can also be extended to rolling shutter image sensor pixels to improve readout operations.

In various embodiments, an image sensor is provided that includes a photodiode configured to accumulate charge generated by scenery light, a first storage node configured to receive and to store the accumulated charge from the photodiode, a second storage node configured to store charge generated by parasitic light and dark noise signals (sometimes referred to collectively as background signals), and circuitry configured to subtract the charge stored in the second storage node from the charge stored in the first storage node to cancel out any undesired signal contribution from the background signals.

The first storage node may include a first charge storage region configured to store low scenery light signals and a first overflow storage region configured to store high scenery light signals. The second storage node may include a second charge storage region configured to store low parasitic light and dark noise signals and a second overflow storage region configured to store high parasitic light and dark noise signals. The circuitry may be configured to compute a first difference between the amount of charge stored in the first charge storage region and the amount of charge stored in the second charge storage region and also to compute a second difference between the amount of charge stored in the first overflow storage region and the amount of charge stored in the second overflow storage region. The circuitry may then combine the first computed difference with the second computed difference to obtain a high dynamic range output signal.

In one suitable implementation, the first charge storage region is a first storage diode; the first overflow storage region is a first overflow capacitor; the second charge storage region is a second storage diode; and the second overflow storage region is a second overflow capacitor. The image sensor may further include a first output gate coupled between the photodiode and the first storage diode, a second output gate coupled between the photodiode and the second storage diode, a first overflow gate coupled between the first storage diode and the first overflow capacitor, a second overflow gate coupled between the second storage diode and the second overflow capacitor, a first transfer gate coupled between the first storage diode and a floating diffusion region, and a second transfer gate coupled between the second storage diode and the floating diffusion region. The first overflow gate, the second overflow gate, and the first output gate are at least partially activated (e.g., pulsed or raised to some intermediate static voltage level) during integration time. If desired, the image sensor may also include a first dual conversion gate coupled between the first overflow capacitor and the floating diffusion region, and a second dual conversion gate coupled between the second overflow capacitor and the floating diffusion region. If desired, the storage diodes may alternatively be implemented as storage gate devices.

The image sensor may be a backside illuminated (BSI) image sensor. In certain embodiments, the image sensor may further include optical diffracting structures (e.g., an array of pyramidal dielectric structures) formed at a back side of the substrate, where the optical diffracting structures are configured to randomize and distribute the parasitic light equally between the first and second storage nodes. If desired, one or more microlenses may be configured to direct incoming light towards the underlying photodiode and may at least partially cover or overlap with the storage node regions.

In another embodiment, an image sensor pixel is provided that includes a photodiode configured to accumulate charge generated by scenery light and a single storage node that is configured to receive and to store charge generated by parasitic light and dark noise signals during a first phase and that is further configured to receive and to store the accumulated charge from the photodiode during a second that is different than the first phase. Additional circuitry is provided that is configured to subtract the charge obtained during the first phase from the charge obtained during the second phase to cancel out any undesired signal contribution from the parasitic light and the dark noise signals. The storage node may include a charge storage region configured to store low light signals and an overflow storage region configured to store high light signals to provide HDR functionality.

In accordance with yet another suitable embodiment, an image sensor pixel is provided that includes a photodiode, a first storage gate coupled directly to the photodiode (where the first storage gate is configured to store charge generated by parasitic light and dark noise signals), a second storage gate coupled directly to the photodiode (where the second storage gate is configured to store charge generated by scenery light), a single overflow capacitor, and an anti-blooming gate coupled between the photodiode and the overflow capacitor. The image sensor pixel may further include a floating diffusion region, a first transfer gate coupled between the first storage gate to the floating diffusion region, and a second transfer gate coupled between the second storage gate to the floating diffusion region. If desired, the pixel may further include a dual conversion gate coupled between the floating diffusion region and a power supply terminal, a reset gate coupled between the dual conversion gate and the power supply terminal, and a low gain transistor coupled between the overflow capacitor and an intermediate node at which the dual conversion gate is connected to the reset gate. The anti-blooming gate may be at least partially activated or pulsed during integration time.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising:
   a photodiode in a front side of a substrate and configured to accumulate charge generated by scenery light;
   a first storage node configured to store the accumulated charge from the photodiode;
   a second storage node configured to store charge generated by parasitic light; and
   optical diffracting structures in a back side of the substrate.

2. The image sensor of claim 1, wherein the optical diffracting structures are configured to distribute the parasitic light evenly between the first and second storage nodes.

3. The image sensor of claim 1, wherein the optical diffracting structures comprise an array of identically shaped dielectric structures.

4. The image sensor of claim 1, further comprising:
   a metal shield on the back side of the substrate and overlapping with the first and second storage nodes.

5. The image sensor of claim 4, wherein the optical diffracting structures extend under the photodiode.

6. The image sensor of claim 1, wherein the optical diffracting structures extend under the photodiode, the first storage node, and the second storage node.

7. The image sensor of claim 6, wherein the photodiode has a portion that extends under the first and second storage nodes.

8. The image sensor of claim 1, further comprising:
   a first microlens configured to focus light towards the photodiode and at least partially overlaps with the first storage node, and
   a second microlens configured to focus light towards the photodiode and at least partially overlaps with the second storage node.

9. The image sensor of claim 1, wherein the first storage node comprises a first charge storage region configured to store low scenery light signals and a first overflow storage region configured to store high scenery light signals.

10. The image sensor of claim 9, wherein the second storage node comprises a second charge storage region configured to store low parasitic light signals and a second overflow storage region configured to store high parasitic light signals.

11. The image sensor of claim 1, further comprising:
    circuitry configured to subtract the charge stored in the second storage node from the charge stored in the first storage node.

12. An image sensor, comprising:
    a photodiode in a front surface of a substrate;
    a first storage gate;
    a second storage gate;
    a floating diffusion region coupled to the photodiode via the first and second storage gates; and
    light diffracting structures in a back surface of the substrate and extending under at least the photodiode.

13. The image sensor of claim 12, wherein the light diffracting structures are configured to disperse light evenly between the first and second storage gates.

14. The image sensor of claim 12, further comprising:
    a plurality of microlenses over the light diffracting structures.

15. The image sensor of claim 12, wherein the light diffracting structures extend under the first and second storage gates.

16. The image sensor of claim 12, further comprising:
    an overflow capacitor; and
    an anti-blooming gate coupled between the photodiode and the overflow capacitor.

17. The image sensor of claim 12, wherein the light diffracting structures comprise dielectric structures selected from the group consisting of: an array of pyramidal dielectric structures, an array of conical dielectric structures, an array of funnel-shaped dielectric structures, and an array of triangular-shaped dielectric structures.

18. An apparatus comprising:
    a photosensitive element in a front surface of a semiconductor substrate;
    a floating diffusion region in the front surface of the semiconductor substrate;
    a first storage node coupled between the photosensitive element and the floating diffusion region;
    a second storage node coupled between the photosensitive element and the floating diffusion region; and
    light diffracting structures in a back surface of the semiconductor substrate and configured to disperse light evenly between the first and second storage nodes.

19. The apparatus of claim 18, wherein the light diffracting structures comprise dielectric structures selected from the group consisting of: an array of pyramidal dielectric structures, an array of conical dielectric structures, an array of funnel-shaped dielectric structures, and an array of triangular-shaped dielectric structures.

* * * * *